United States Patent
Kao et al.

(10) Patent No.: US 12,368,116 B2
(45) Date of Patent: Jul. 22, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Feng Kao, Taichung (TW); Lung-Yuan Wang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 485 days.

(21) Appl. No.: 17/944,453

(22) Filed: Sep. 14, 2022

(65) Prior Publication Data

US 2023/0420391 A1 Dec. 28, 2023

(30) Foreign Application Priority Data

Jun. 24, 2022 (TW) .................................. 111123709

(51) Int. Cl.
| | |
|---|---|
| *H01L 23/00* | (2006.01) |
| *G02B 6/12* | (2006.01) |
| *G02B 6/13* | (2006.01) |
| *H01L 21/56* | (2006.01) |
| *H01L 23/31* | (2006.01) |
| *H01L 23/498* | (2006.01) |

(52) U.S. Cl.
CPC ............. *H01L 23/564* (2013.01); *G02B 6/12* (2013.01); *G02B 6/13* (2013.01); *H01L 21/563* (2013.01); *H01L 23/3185* (2013.01); *H01L 23/49811* (2013.01); *H01L 24/16* (2013.01); *H01L 24/32* (2013.01); *H01L 24/73* (2013.01); *G02B 2006/121* (2013.01); *H01L 23/49827* (2013.01); *H01L 2224/16227* (2013.01); *H01L 2224/32225* (2013.01); *H01L 2224/73204* (2013.01)

(58) Field of Classification Search
CPC ............... H01L 23/564; H01L 23/3185; H01L 23/49811; H01L 23/49827; H01L 21/563; H01L 24/16; H01L 24/32; H01L 24/73; H01L 2224/16227; H01L 2224/32225; H01L 2224/73204; G02B 2006/121
See application file for complete search history.

(56) References Cited

U.S. PATENT DOCUMENTS

| | | | |
|---|---|---|---|
| 2020/0105705 A1* | 4/2020 | Cheng | ..................... H01L 25/50 |
| 2021/0366802 A1* | 11/2021 | Huang | ................... H01L 25/167 |
| 2022/0365295 A1* | 11/2022 | Jiang | ....................... H01L 24/17 |

* cited by examiner

*Primary Examiner* — Peniel M Gumedzoe
(74) *Attorney, Agent, or Firm* — Dority & Manning, P.A.

(57) ABSTRACT

An electronic package is provided, in which an electronic element that is electrically connected to a plurality of conductive vias and a functional part that has a hollow area are disposed on a photonic die that has the plurality of conductive vias and at least one external connection portion, where a cladding layer covers the electronic element and the functional part, such that the external connection portion is exposed from the hollow area and the cladding layer for an optical fiber to insert into the hollow area and connect to the external connection portion, so as to achieve the purpose of optoelectronic integration.

13 Claims, 9 Drawing Sheets

ELECTRONIC PACKAGE AND MANUFACTURING METHOD THEREOF

BACKGROUND

1. Technical Field

The present disclosure relates to a semiconductor device, and more particularly, to an electronic package with photonic dies and a manufacturing method thereof.

2. Description of Related Art

With the vigorous development of the electronic industry, electronic products are also gradually moving towards the trend of multi-function and high performance. At present, the application of the fifth generation (5G) communication technology has been extended to the fields such as the Internet of Things (IoT), Industrial Internet of Things (IIoT), Cloud, Artificial Intelligence (AI), Autonomous Vehicle, Medical, etc., and with the expansion of the application, a very large amount of data will be generated in the process, which needs to be efficiently transmitted, computed and stored. Therefore, in recent years, large data centers and cloud servers have a large number of data transmission requirements, and the industry has begun to enter the field of optical communication, using "light" instead of "electricity" as the carrier of data transmission.

Optical communication can improve transmission capacity/efficiency/distance to increase data bandwidth and reduce unit energy consumption. Therefore, the value of existence and research/development of silicon photonics elements and their application products have begun to be re-emphasized.

Therefore, how to integrate silicon photonic elements in the packaging process has become an urgent problem to be overcome in the current industry.

SUMMARY

In view of the various deficiencies of the prior art, the present disclosure provides an electronic package, comprising: a photonic die having a first side and a second side opposing the first side and a plurality of conductive vias connecting the first side and the second side, wherein the first side is configured with an external connection portion that is electrically connected to the plurality of conductive vias and a plurality of dummy pads that are free from being electrically connected to the plurality of conductive vias and the external connection portion; an electronic element disposed on the first side of the photonic die and electrically connected to the plurality of conductive vias; a functional part disposed on the first side of the photonic die by bonding a plurality of dummy bumps on the plurality of dummy pads, and the functional part having a hollow area penetrating through the functional part, wherein the external connection portion is exposed from the hollow area, and wherein the functional part is free from being electrically connected to the photonic die; and a cladding layer disposed on the first side of the photonic die and covering the electronic element and the functional part, wherein the hollow area is exposed from the cladding layer for an optical fiber to connect to the external connection portion in the hollow area.

The present disclosure further provides a method of manufacturing an electronic package, comprising: providing a photonic die, an electronic element and a functional part having a concave portion, wherein the photonic die has a first side and a second side opposing the first side and a plurality of conductive vias connecting the first side and the second side, and wherein the first side is configured with an external connection portion and a plurality of electrical contact pads that are electrically connected to the plurality of conductive vias, and the first side is further configured with a plurality of dummy pads that are free from being electrically connected to the plurality of conductive vias and the external connection portion; disposing the electronic element on the plurality of electrical contact pads on the first side of the photonic die, disposing the functional part on the first side of the photonic die with the concave portion thereof facing the external connection portion by bonding a plurality of dummy bumps onto the plurality of dummy pads, and superimposing the concave portion on the external connection portion, wherein the electronic element is electrically connected to the plurality of conductive vias, and the functional part is free from being electrically connected to the photonic die; forming a cladding layer on the first side of the photonic die, wherein the cladding layer covers the electronic element and the functional part; and removing a part of a material of the cladding layer and a part of a material of the functional part, wherein the concave portion forms a hollow area penetrating through the functional part, such that the external connection portion is exposed from the hollow area and the cladding layer.

In the aforementioned method, a single grinding operation is used to remove the part of the material of the cladding layer and the part of the material of the functional part.

In the aforementioned electronic package and the manufacturing method, the method further comprises disposing at least one dam on the first side of the photonic die, wherein the plurality of dummy pads surround the dam, such that the dam surrounds the external connection portion and is correspondingly disposed along an edge of the hollow area after the hollow area is formed.

In the aforementioned electronic package and the manufacturing method, the method further comprises disposing a package substrate on the second side of the photonic die after forming the hollow area.

In the aforementioned electronic package and the manufacturing method, the method further comprises disposing a package substrate on the second side of the photonic die before forming the hollow area. The method further comprises disposing at least one stopper on the package substrate before forming the hollow area, wherein the stopper surrounds the photonic die.

In the aforementioned electronic package and the manufacturing method, the plurality of dummy bumps include solder material.

As can be seen from the above, in the electronic package and manufacturing method thereof of the present disclosure, via the design of the photonic die having the conductive vias, the electronic element is stacked and vertically integrated on the package substrate. Accordingly, not only the purpose of optoelectronic integration is achieved, but also the signals of the electronic element can be directly transmitted to the photonic die, and the signals of the photonic die can be directly transmitted to the optical fiber. Therefore, the signal transmission path between the electronic element and the optical fiber can be greatly shorten, so as to effectively speed up the signal transmission. Therefore, the performance requirement of the electronic package for fast operation can be met, thereby making the electronic product using the electronic package competitive in the consumer market.

BRIEF DESCRIPTION OF THE DRAWINGS

FIG. 4A-1 is a schematic cross-sectional view of another embodiment of FIG. 2A.

FIG. 4A-2 is a schematic partial top view of the subsequent process of FIG. 4A-1.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "above," "upper," "first," "second," "a," "an," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 1:
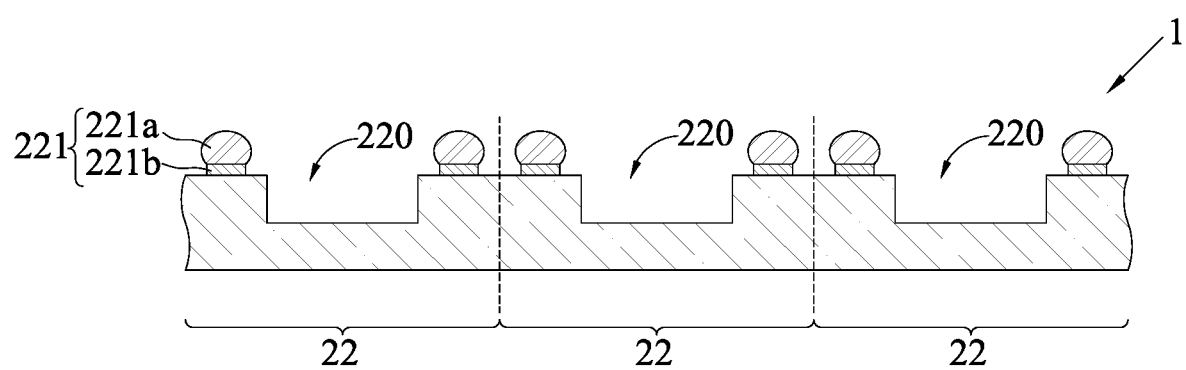
FIG. 1 is a schematic cross-sectional view of a pre-processing step of a first embodiment of a manufacturing method of an electronic package according to the present disclosure.

FIG. 1 is a schematic cross-sectional view of a pre-processing step of a first embodiment of a manufacturing method of an electronic package 2 according to the present disclosure. FIG. 2A to FIG. 2D are schematic cross-sectional views of the first embodiment of the manufacturing method of the electronic package 2 according to the present disclosure.

As shown in FIG. 1, a semiconductor substrate 1 including a plurality of functional parts 22 arranged in an array is subjected to a singulation operation, in order to obtain a plurality of functional parts 22 having concave portions 220 and a plurality of dummy bumps 221.

In one embodiment, each of the dummy bumps 221 includes a solder material 221a and/or other metal materials, such as a copper (Cu) pillar 221b.

Figure 2A:
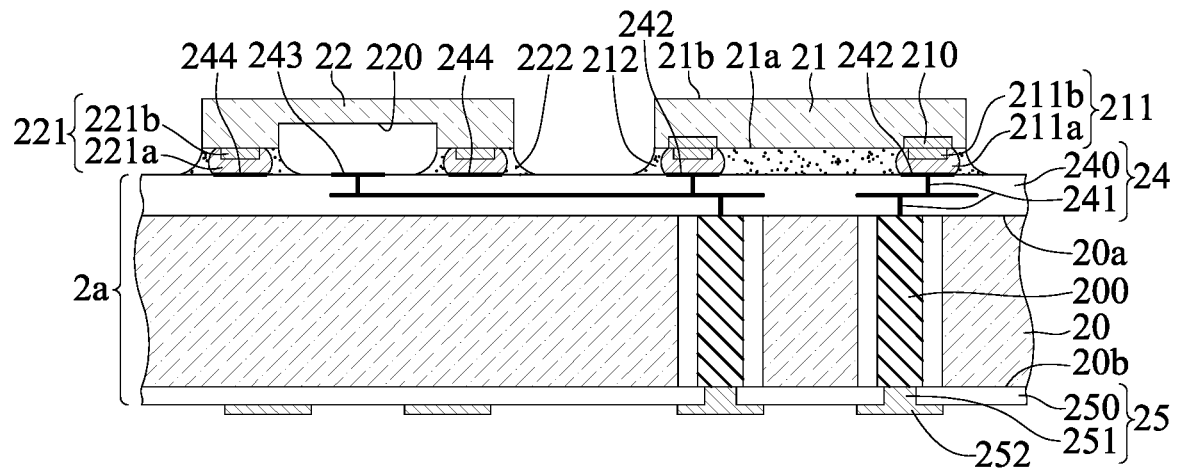
FIG. 2A to FIG. 2D are schematic cross-sectional views of the first embodiment of the manufacturing method of the electronic package according to the present disclosure.

As shown in FIG. 2A, a wafer form board body or a full-panel board body including a plurality of photonic dies 2a arranged in an array, at least one electronic element 21 and at least one functional part 22 having a concave portion 220 are provided. The electronic element 21 and the functional part 22 are disposed on the photonic die 2a.

The photonic die 2a includes a semiconductor structure 20, such as a silicon substrate, a glass board, or other suitable boards, and the semiconductor structure 20 has a first side 20a and a second side 20b opposing the first side 20a, so as to use a through-silicon via (TSV) process to form a plurality of conductive vias 200 connecting the first side 20a and the second side 20b.

In an embodiment, the photonic die 2a further includes at least one circuit structure 24 disposed on the first side 20a and electrically connected to the conductive vias 200, and the circuit structure 24 has at least one dielectric layer 240, at least one redistribution layer (RDL) 241 disposed on the dielectric layer 240 and electrically connected to the conductive vias 200, and a plurality of dummy pads 244 disposed on the dielectric layer 240 and exposed from the dielectric layer 240, wherein the outermost redistribution layer 241 has a plurality of electrical contact pads 242 (e.g., micro pads, commonly known as μ-pads) exposed from the dielectric layer 240, and wherein at least one of the plurality of electrical contact pads 242 is used as an external connection portion 243, so that the dummy pads 244 surround the external connection portion 243. For example, the material for forming the redistribution layer 241 is copper, and the material for forming the dielectric layer 240 is polybenzoxazole (PBO), polyimide (PI), prepreg (PP), or other dielectric materials.

Furthermore, the photonic die 2a may form a routing structure 25 electrically connected to the conductive vias 200 on the second side 20b of the semiconductor structure 20 thereof. For example, the routing structure 25 includes at least one insulating layer 250 and a circuit layer 251 disposed on the insulating layer 250 and electrically connected to the conductive vias 200, wherein the circuit layer 251 may have a plurality of electrical contact pads 252, such as of the C4 type specification. For example, the material for forming the circuit layer 251 is copper, and the material for forming the insulating layer 250 is polybenzoxazole (PBO), polyimide (PI), prepreg (PP), or others dielectric materials.

In addition, the dummy pads 244 and the redistribution layer 241 are arranged separately and are free from being connected to each other. Therefore, the dummy pads 244 are free from being electrically connected to the redistribution layer 241, so that the dummy pads 244 are free from having signal transmission function.

The electronic element 21 is an active element, a passive element, or a combination of the active element and the passive element, wherein the active element is such as a semiconductor chip, and the passive element is such as a resistor, a capacitor, or an inductor.

In one embodiment, the electronic element 21 is a semiconductor chip, which has an active surface 21a and an inactive surface 21b opposing the active surface 21a, wherein the active surface 21a has a plurality of electrode pads 210 for soldering the redistribution layer 241 in a flip chip manner via a plurality of conductive bumps 211, and the conductive bumps 211 are covered by an underfill 212. For example, each of the conductive bumps 211 includes a solder material 211a and/or other metal materials, such as a copper pillar 211b.

It should be understood that there are various ways in which the electronic element 21 is electrically connected to the photonic die 2a. For example, the electronic element 21 can be electrically connected to the redistribution layer 241 in a wire-bonding manner via a plurality of bonding wires (not shown), or the electronic element 21 can directly contact the redistribution layer 241, and the present disclosure is not limited to as such.

The functional part 22 is bonded onto the dummy pads 244 via a plurality of dummy bumps 221, so that the functional part 22 cannot be electrically connected to the photonic die 2a or the circuit structure 24, and the concave portion 220 of the functional part 22 is correspondingly disposed above the external connection portion 243, wherein the concave portion 220 is free from penetrating through the functional part 22.

In one embodiment, the functional part 22 is a semiconductor structure and is free from having electrodes (such as dummy dies) for transmitting signals. Therefore, for the purpose of simplifying the manufacturing process, the functional part 22 and the electronic element 21 can be disposed on the photonic die 2a by adopting the same manufacturing process. For example, using a flip-chip process, the functional part 22 is soldered onto the first side 20a of the photonic die 2a or the circuit structure 24 via the plurality of dummy bumps 221 with the concave portion 220 facing the photonic die 2a (or the circuit structure 24), and then the dummy bumps 221 are covered by an underfill 222, wherein the dummy bumps 221 are used for support and are free from having signal transmission function, so the solder material 211a and/or other metal materials are used to increase the support force.

Therefore, the functional part 22 can not only enhance the bonding force by soldering the dummy bumps 221, but also can use the same die bond process as the electronic element 21, so as to reduce the switching time of different die bond processes on the production line.

Furthermore, the underfill 222 is free from covering the external connection portion 243, and the underfill 222 may or may not be filled in the concave portion 220.

Figure 2B:
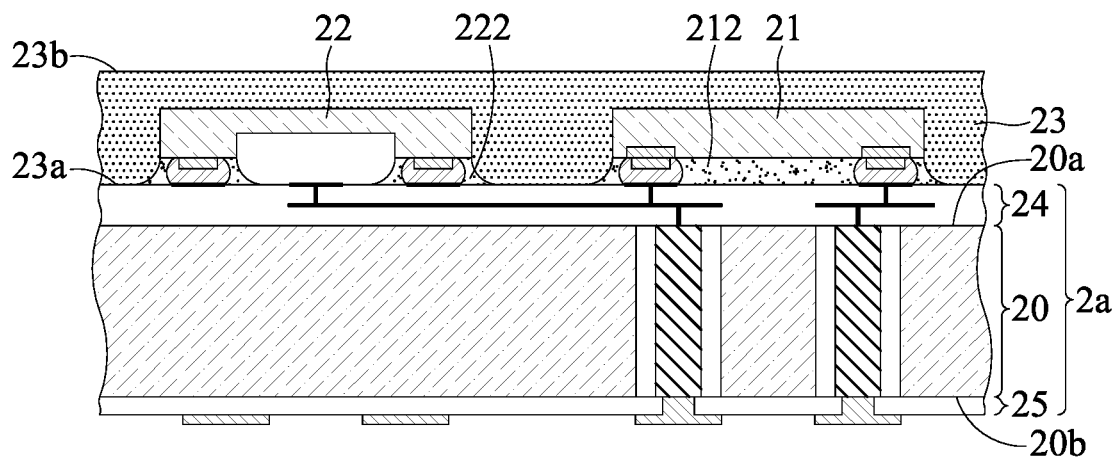

As shown in FIG. 2B, a cladding layer 23 is formed on the first side 20a (or the circuit structure 24) of the photonic die 2a, so that the cladding layer 23 covers the electronic element 21, the functional part 22 and the underfills 212, 222, such that the cladding layer 23 protects the electronic element 21 to strengthen the structural strength of the overall package, wherein the cladding layer 23 has a first surface 23a and a second surface 23b opposing the first surface 23a, so that the cladding layer 23 is bonded onto the dielectric layer 240 of the circuit structure 24 (or the first side 20a of the photonic die 2a) with the first surface 23a thereof.

In one embodiment, the cladding layer 23 is made of an insulating material, such as polyimide (PI), dry film, encapsulant such as epoxy resin, or molding compound. For example, the cladding layer 23 may be formed on the circuit structure 24 (or the first side 20a of the photonic die 2a) by liquid compound, injection, lamination, or compression molding.

Figure 2C:
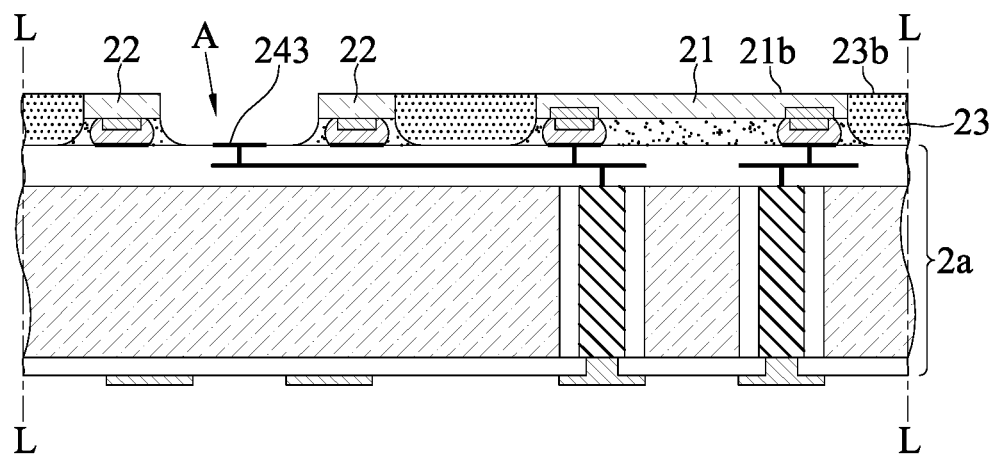

As shown in FIG. 2C, part of the material of the second surface 23b of the cladding layer 23 and part of the material of the functional part 22 are removed, so that the concave portion 220 previously located in the functional part 22 penetrates through the thinned functional part 22 to serve as a hollow area A, such that the external connection portion 243 is exposed from the hollow area A and the second surface 23b of the cladding layer 23.

In one embodiment, a single grinding operation may be used to remove part of the material of the second surface 23b of the cladding layer 23 and part of the material of the functional part 22.

Furthermore, a leveling process can be performed by grinding, so that the second surface 23b of the cladding layer 23 is flush with the inactive surface 21b of the electronic element 21, such that the inactive surface 21b of the electronic element 21 is exposed from the second surface 23b of the cladding layer 23. It should be understood that the leveling process can remove part of the material of the inactive surface 21b of the electronic element 21 according to requirements.

Figure 2D:
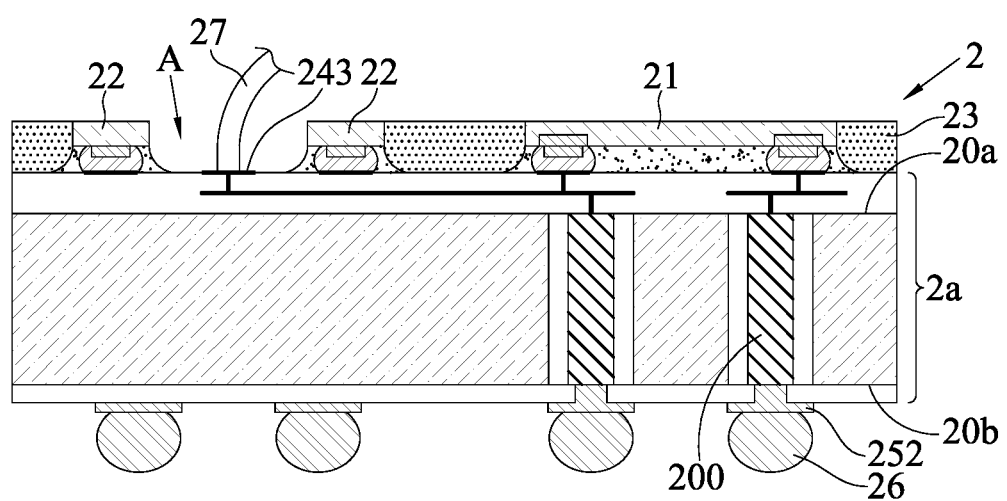

As shown in FIG. 2D, after the hollow area A is formed, a plurality of conductive elements 26 such as solder bumps or solder balls are bonded to the electrical contact pads 252 on the second side 20b of the photonic die 2a, so that the photonic die 2a is electrically connected to the conductive elements 26. Then, a singulation process is performed along cutting paths L shown in FIG. 2C to obtain a plurality of electronic packages 2.

In one embodiment, at least one optical fiber 27 can be inserted into the hollow area A according to requirements, so that the optical fiber 27 is electrically connected to the external connection portion 243. It should be understood that the functional part 22 surrounds the external connection portion 243 to form a slot for the optical fiber 27 to align the external connection portion 243. Therefore, the functional part 22 does not need to be equipped with a circuit, which is different from the structure of the conventional electronic connector that needs to be equipped with a circuit.

Figure 2E:
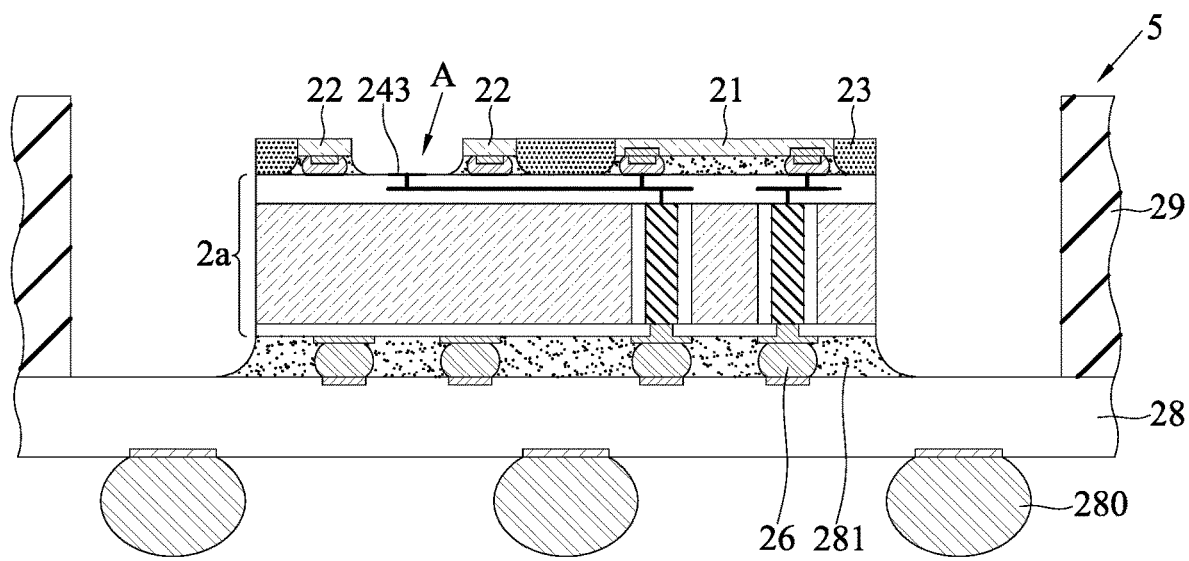
FIG. 2E is a schematic cross-sectional view of the subsequent process of FIG. 2D.

Furthermore, in another aspect of an electronic package 5 shown in FIG. 2E, the photonic die 2a can also be disposed on an upper side of a package substrate 28 via the conductive elements 26, so that the photonic die 2a is electrically connected to the package substrate 28, and then an underfill 281 is formed on the package substrate 28 to cover the conductive elements 26, so that a ball-placement process can be performed on a lower side of the package substrate 28 to form a plurality of solder balls 280 electrically connected to the package substrate 28, and for subsequent processes, the electronic package 5 can be disposed on a circuit board (not shown) via the solder balls 280. Further, a heat sink 29 can be disposed on the upper side of the package substrate 28 according to requirements.

Figure 2F:
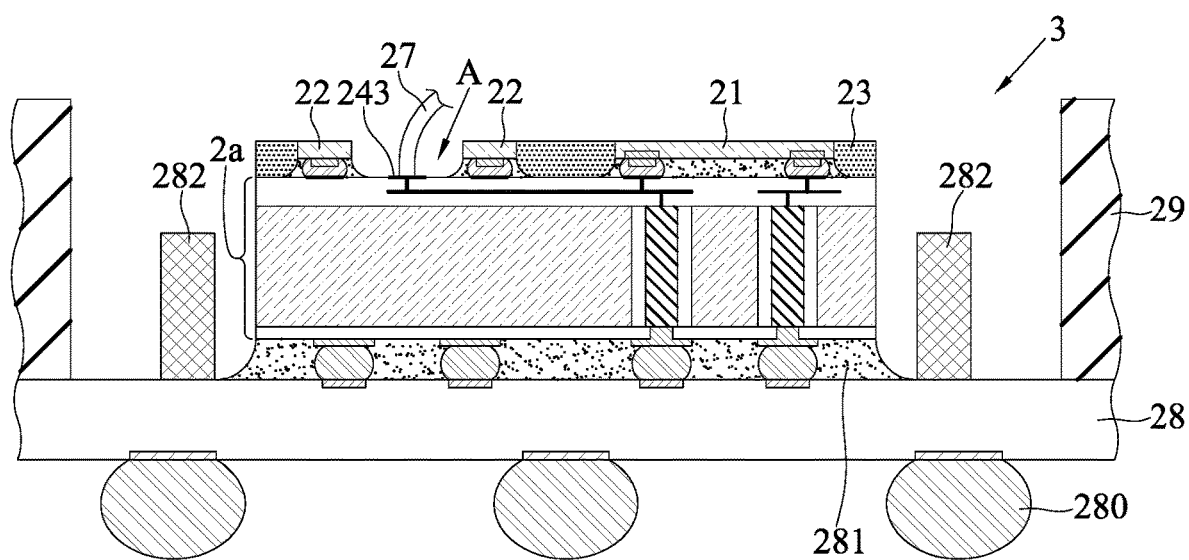
FIG. 2F is a schematic cross-sectional view of another embodiment of FIG. 2E.

Preferably, as shown in FIG. 2F, before forming the underfill 281, at least one stopper 282 (which surrounds the photonic die 2a) manufactured by such as an insulating material, a semiconductor material, or a conductive material may be arranged on the package substrate 28 to limit a layout area of the underfill 281, so as to avoid the problem of the underfill 281 overflowing to other areas on the package substrate 28 and contaminating the circuit.

Therefore, in the manufacturing method of the present disclosure, via the design of the photonic die 2a having the conductive vias 200, the electronic element 21 is stacked and vertically integrated on the package substrate 28. Accordingly, not only the purpose of optoelectronic integration is achieved, but also the signals of the electronic element 21 can be directly transmitted to the photonic die 2a, and the signals of the photonic die 2a can be directly transmitted to the optical fiber 27 via the hollow area A. Therefore, the electronic package 2 of the present disclosure can greatly shorten the signal transmission path between the electronic element 21 and the optical fiber 27, so as to effectively speed up the signal transmission. Therefore, the performance requirement of the electronic package 2 for fast operation can be met, thereby making the electronic product using the electronic package 2 competitive in the consumer market.

Moreover, in another aspect, the signal transmission path between the electronic element 21 and the optical fiber 27 may be in the sequence of the electronic element 21, the photonic die 2a, the package substrate 28, the photonic die 2a and the optical fiber 27. Therefore, signals only need to be transmitted through the package substrate 28 once, so the signal transmission path between the electronic element 21 and the optical fiber 27 of the electronic packages 3, 5 of the present disclosure still meet the requirements.

Furthermore, via the design of the functional part 22 forming the hollow area A, the position of the hollow area A corresponds to the position of the external connection portion 243 of the photonic die 2a (i.e., the optical fiber connection position), and the external connection portion 243 is exposed for alignment of the optical fiber 27 to facilitate connection of the optical fiber 27.

In addition, the concave portion 220 is superimposed on the external connection portion 243 by the functional part 22 correspondingly covering the external connection portion 243 of the photonic die 2a, so that the cladding layer 23 will not cover the external connection portion 243 (i.e., the optical fiber connection position) when the cladding layer 23 is formed. Therefore, when the functional part 22 is ground to form the hollow area A, the external connection portion 243 (i.e., the optical fiber connection position) can be directly exposed without further removing the material of the cladding layer 23 or other materials on the external connection portion 243.

FIG. 3A to FIG. 3D are schematic cross-sectional views of a second embodiment of a manufacturing method of an electronic package 3 according to the present disclosure. The difference between the second embodiment and the first embodiment lies in the steps of forming the hollow area A, and other manufacturing processes are substantially the same, so the similarities will not be repeated below.

Figure 3A:
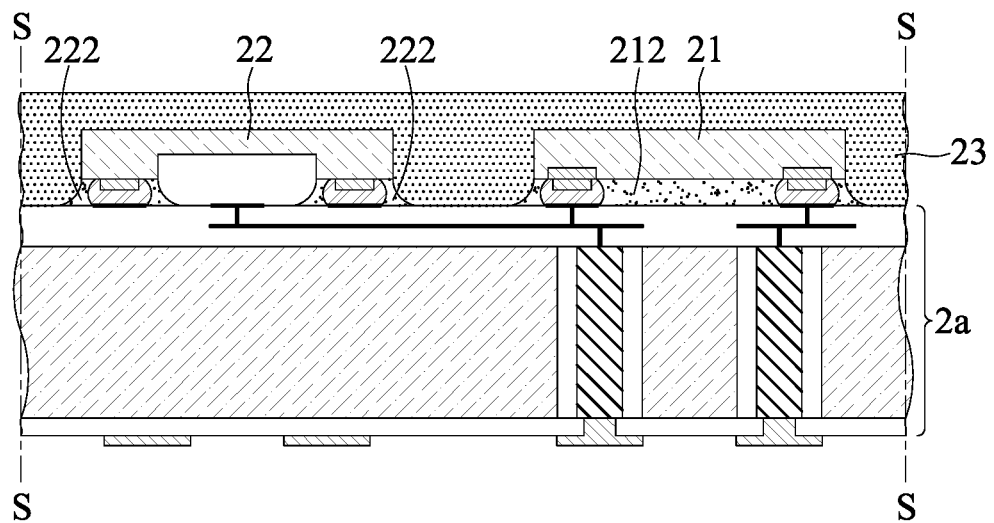
FIG. 3A to FIG. 3E are schematic cross-sectional views of a second embodiment of the manufacturing method of the electronic package according to the present disclosure.

As shown in FIG. 3A, the process shown in FIG. 2A to FIG. 2B is adopted, and the electronic element 21 and the functional part 22 are disposed on the photonic die 2a, and then the cladding layer 23 is used to cover the electronic element 21, the functional part 22 and the underfills 212, 222.

Figure 3B:
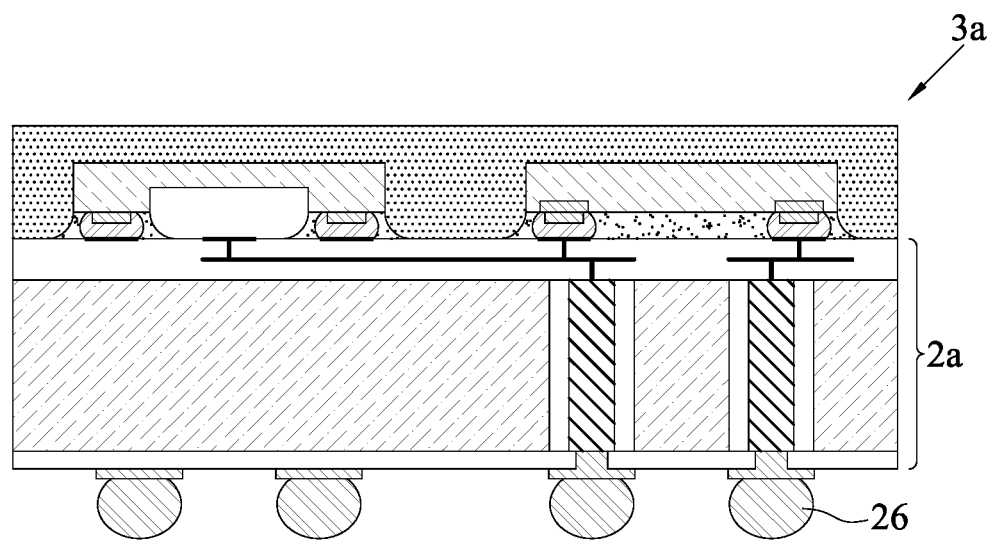

As shown in FIG. 3B, the conductive elements 26 are formed on the photonic die 2a, and then a singulation process is performed along cutting paths S shown in FIG. 3A to obtain a plurality of package modules 3a. In one embodiment, after the singulation process is completed, the hollow area A has not been formed.

Figure 3C:
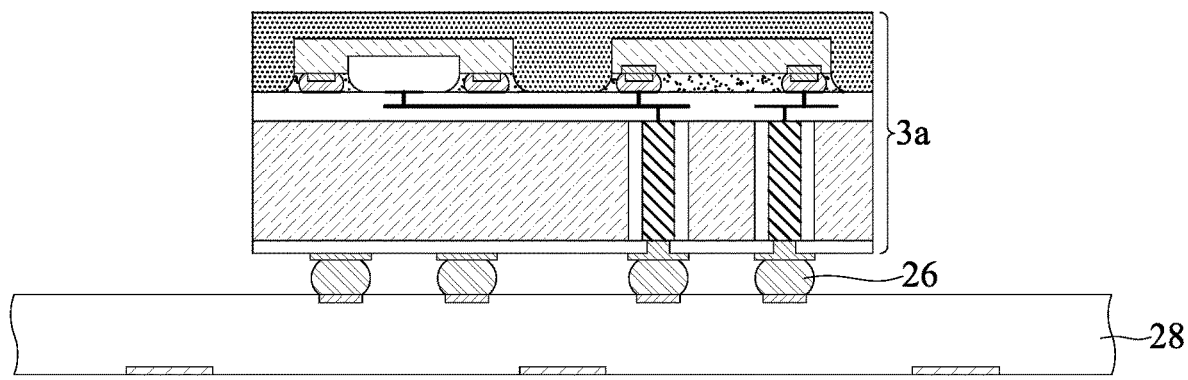

As shown in FIG. 3C, the package module 3a is disposed on an upper side of a package substrate 28 via the conductive elements 26.

Figure 3D:
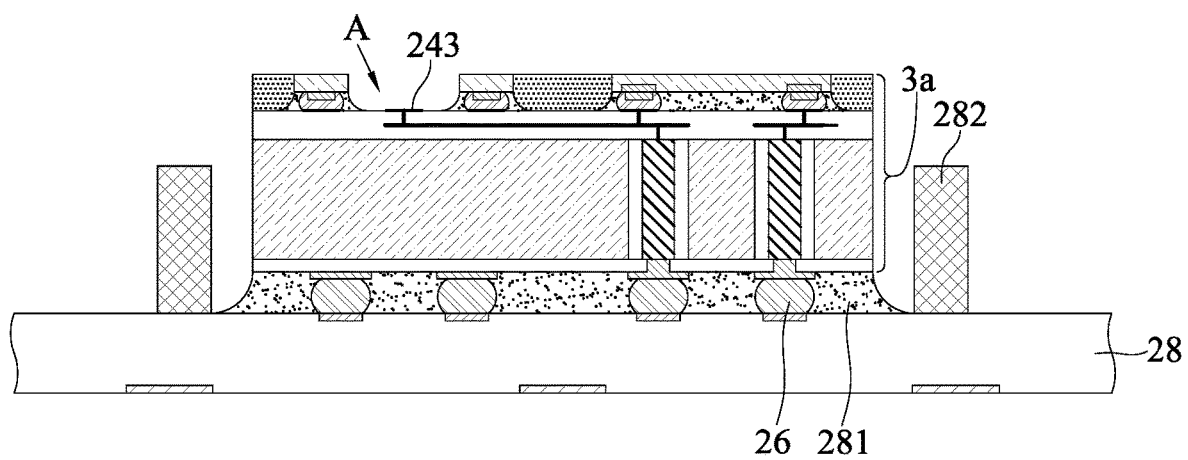

As shown in FIG. 3D, the stopper 282 is formed on the package substrate 28, and then the conductive elements 26 are covered by an underfill 281. Then, part of the material of the second surface 23b of the cladding layer 23 and part of the material of the functional part 22 are removed by grinding, so that the hollow area A is formed by the concave portion 220, and the external connection portion 243 is exposed from the hollow area A.

Figure 3E:
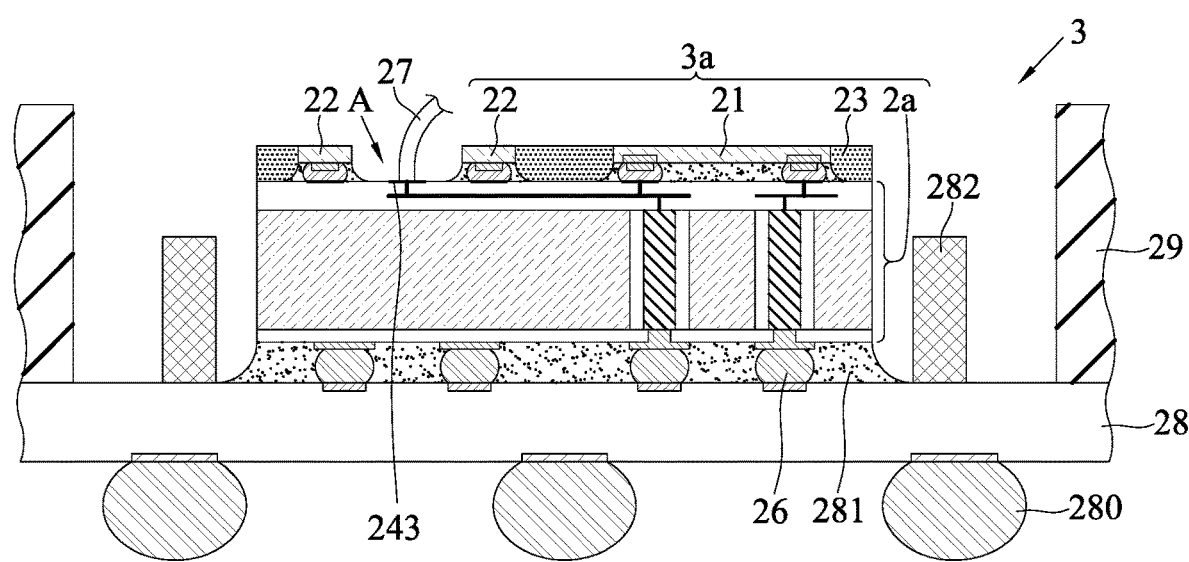

In one embodiment, a heat sink 29 may be disposed on the upper side of the package substrate 28, and a ball-placement process may be performed on a lower side of the package substrate 28 to form a plurality of solder balls 280, as shown in FIG. 3E.

Therefore, the manufacturing method of the first embodiment and the manufacturing method of the second embodiment can produce the same electronic package 3 (as shown in FIG. 3E or FIG. 2F). However, in the manufacturing method of the second embodiment, a singulation process is performed to obtain the package module 3a first, and then the hollow area A is formed on the package module 3a on the package substrate 28. Therefore, compared with the manufacturing method of the first embodiment, the manufacturing method of the second embodiment can effectively improve the process yield when applied to a large-sized package. For example, in the process of transporting the electronic package 2 shown in FIG. 2D to the package substrate 28 after the singulation process in the first embodiment, foreign objects are likely to fall into the hollow area A, resulting in that the optical fiber 27 cannot effectively electrically connect the photonic die 2a. Therefore, when the electronic package 5 is subjected to electrical testing, the problem of disconnection is likely to occur, resulting in that the electronic package 2 cannot meet the reliability requirements of electronic products.

Furthermore, in the manufacturing method of the second embodiment, the stopper 282 is formed first, and then the grinding operation for forming the hollow area A is performed. Therefore, during the grinding operation, as shown in FIG. 3D, the stopper 282 can increase the overall structural strength to disperse the grinding stress, thereby improving the yield and reliability of the electronic package 3.

Furthermore, in the manufacturing method of the first embodiment, a grinding operation is performed on a wafer form board body or a full-panel board body (i.e., the photonic die 2a before the singulation process) to form the hollow area A. Therefore, only one grinding operation is required to produce the required number of electronic packages 2, 5. In contrast, in the manufacturing method of the second embodiment, the grinding operation for forming the hollow area A is performed on the plurality of package modules 3a obtained after the singulation process, respectively. Therefore, multiple grinding operations are required to produce the required number of electronic packages 3. Therefore, the productivity of the first embodiment is higher than the productivity of the second embodiment.

Figures 1, 4A:
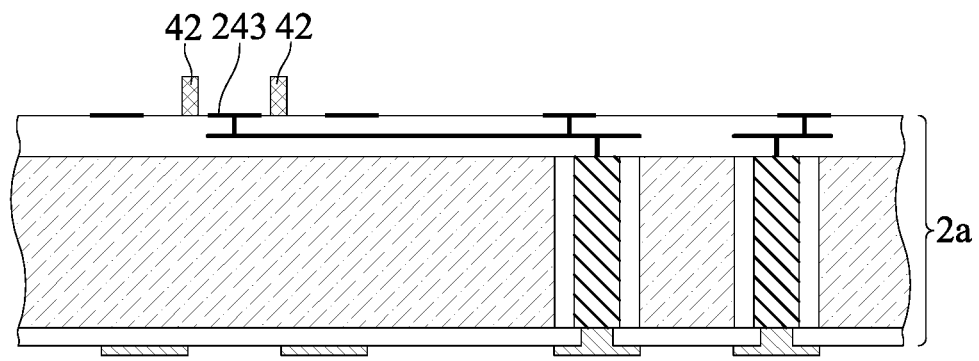
Figures 2, 4A:
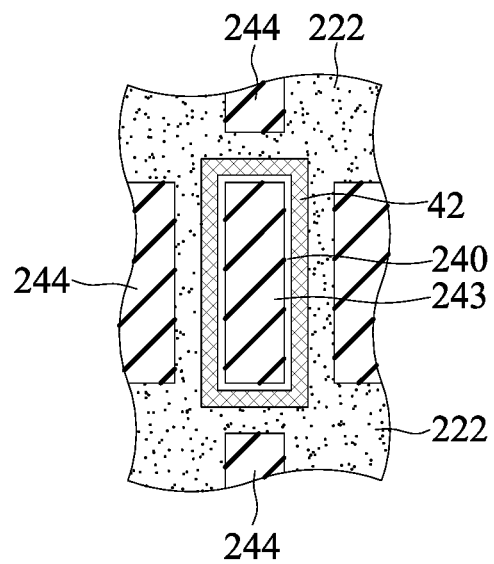
Figure 4B:
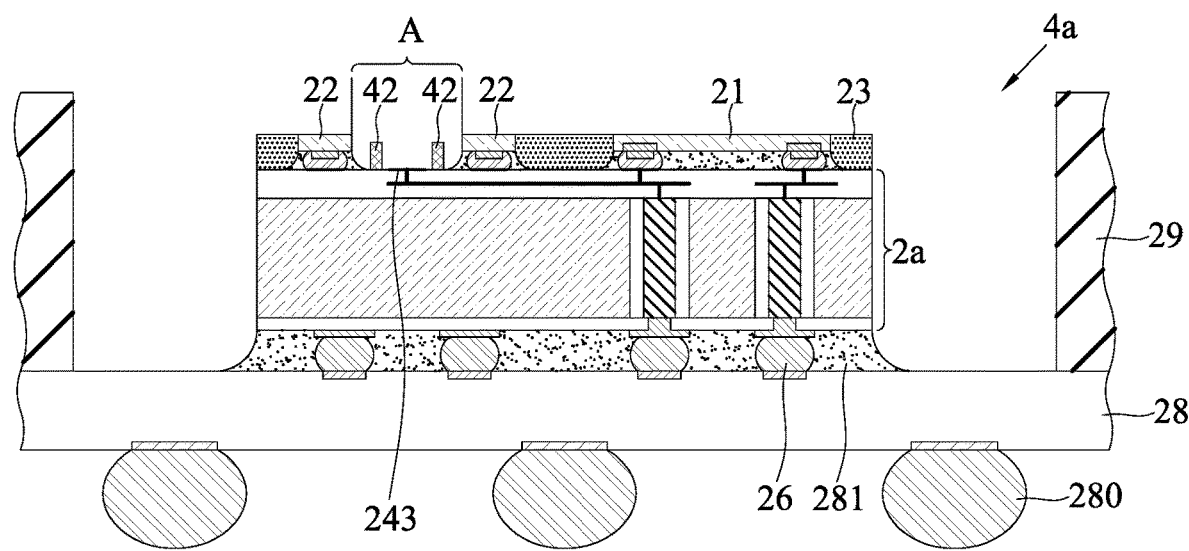
FIG. 4B is a schematic cross-sectional view of the subsequent process of FIG. 4A-1.
Figure 4C:
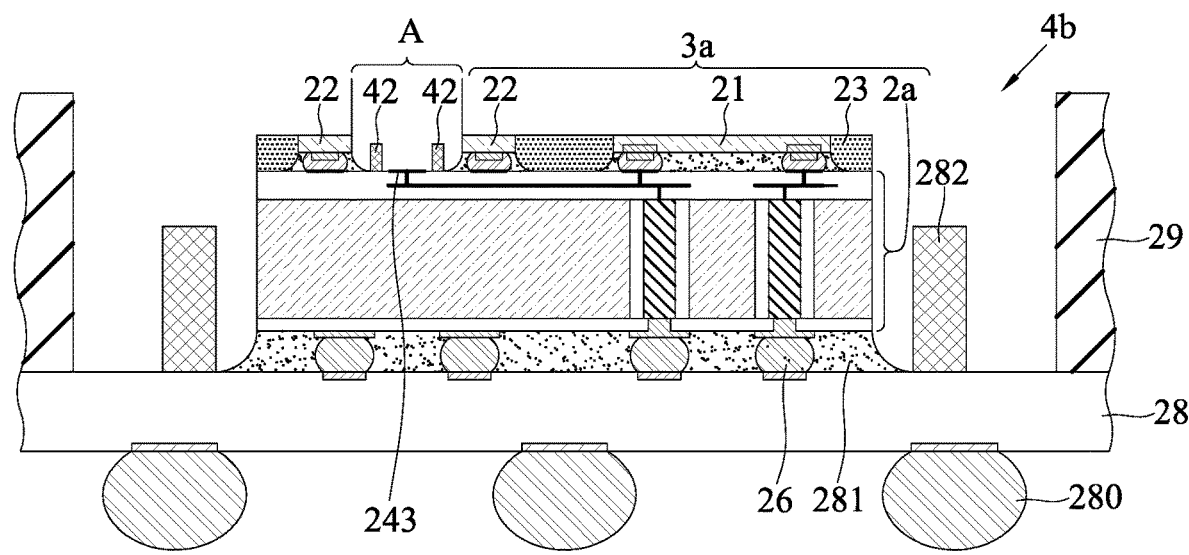
FIG. 4C is a schematic cross-sectional view of another aspect of FIG. 4B.

In addition, as shown in FIG. 4A-1 and FIG. 4A-2, based on the first and second embodiments, before the functional part 22 is disposed on the photonic die 2a (i.e., before the process shown in FIG. 2A), at least one dam (e.g., block) 42 may be first formed on the first side 20a of the photonic die 2a, so that the plurality of dummy pads 244 surround the dam 42, and the dam 42 surrounds the external connection portion 243. Then, the functional part 22 is disposed on the photonic die 2a with the concave portion 220 thereof, so as to limit the layout area of the underfill 222 when forming the underfill 222 for covering the supporting dummy bumps 221, thereby avoiding the problem that the underfill 222 overflows and covers the external connection portion 243, as shown in FIG. 4A-2. Therefore, after the hollow area A is formed, the dam 42 and the external connection portion 243 will be exposed from the hollow area A together, as shown in an electronic package 4a shown in FIG. 4B (the manufacturing method of the first embodiment can be used) or an electronic package 4b shown in FIG. 4C (the manufacturing method of the second embodiment can be used), and the dam 42 is correspondingly disposed along the edge of the hollow area A.

It should be understood that there are various types of the dam 42, for example, the insulating material such as underfill is formed by dispensing (preferred embodiment) or other methods (e.g., electroplating metal, placing semiconductor preforms by adhesive), and the present disclosure is not limited to as such.

Therefore, the configuration of the dam 42 can prevent the underfill 222 between the photonic die 2a and the functional part 22 from overflowing to the external connection portion 243 (i.e., the optical fiber connection position), thereby avoiding the problem that the optical fiber 27 cannot be smoothly welded to the external connection portion 243 (i.e., the optical fiber connection position).

The present disclosure also provides an electronic package 2, 3, 4a, 4b, 5, comprising: a photonic die 2a, an electronic element 21, a functional part 22 and a cladding layer 23.

The photonic die 2a has a first side 20a and a second side 20b opposing the first side 20a, and a plurality of conductive vias 200 communicating with the first side 20a and the second side 20b, wherein the first side 20a is configured with at least one external connection portion 243 electrically connected to the plurality of conductive vias 200 and a plurality of dummy pads 244 not electrically connected to the plurality of conductive vias 200 and the external connection portion 243.

The electronic element 21 is disposed on the first side 20a of the photonic die 2a and is electrically connected to the plurality of conductive vias 200.

The functional part 22 is disposed on the first side 20a of the photonic die 2a by bonding a plurality of dummy bumps 221 on the plurality of dummy pads 244, and the functional part 22 has at least one hollow area A penetrating through the functional part 22, so that the external connection portion 243 is exposed from the hollow area A, wherein the functional part 22 is free from being electrically connected to the photonic die 2a.

The cladding layer 23 is disposed on the first side 20a of the photonic die 2a and covers the electronic element 21 and the functional part 22, so that the hollow area A is exposed from the cladding layer 23, and the optical fiber 27 can extend (e.g., insert) into the hollow area A to connect to the external connection portion 243.

In one embodiment, the first side 20a of the photonic die 2a is provided with at least one dam 42 surrounding the external connection portion 243, so that the plurality of dummy pads 244 surround the dam 42, and the dam 42 is correspondingly disposed along the edge of the hollow area A.

In one embodiment, the electronic package 3, 4a, 4b, 5 further comprises a package substrate 28 connected to the second side 20b of the photonic die 2a. For example, at least one stopper 282 surrounding the photonic die 2a is disposed on the package substrate 28. Alternatively, a heat sink 29 is disposed on the package substrate 28.

In one embodiment, the plurality of dummy bumps 221 comprise solder material.

To sum up, in the electronic package and manufacturing method thereof of the present disclosure, via the design of the photonic die having the conductive vias, the electronic element is stacked and vertically integrated on the package substrate. Accordingly, not only the purpose of optoelectronic integration is achieved, but also the signals of the electronic element can be directly transmitted to the photonic die, and the signals of the photonic die can be directly transmitted to the optical fiber via the hollow area. Therefore, the electronic package of the present disclosure can greatly shorten the signal transmission path between the electronic element and the optical fiber, so as to effectively speed up the signal transmission. Therefore, the performance requirement of the electronic package for fast operation can be met, thereby making the electronic product using the electronic package competitive in the consumer market.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
    a photonic die having a first side and a second side opposing the first side and a plurality of conductive vias connecting the first side and the second side, wherein the first side is configured with an external connection portion that is electrically connected to the plurality of conductive vias, and a plurality of dummy pads that are free from being electrically connected to the plurality of conductive vias and the external connection portion;
    an electronic element disposed on the first side of the photonic die and electrically connected to the plurality of conductive vias;
    a functional part disposed on the first side of the photonic die by bonding a plurality of dummy bumps on the plurality of dummy pads, and the functional part having a hollow area penetrating through the functional part, wherein the external connection portion is exposed from the hollow area, and wherein the functional part is free from being electrically connected to the photonic die; and
    a cladding layer disposed on the first side of the photonic die and covering the electronic element and the functional part, wherein the hollow area is exposed from the cladding layer for an optical fiber to connect to the external connection portion in the hollow area,
    wherein the photonic die further has at least one circuit structure disposed on the first side, the circuit structure has at least one dielectric layer and at least one redistribution layer, the electronic element, the functional part, the plurality of dummy bumps and the cladding layer are above the dielectric layer and the redistribution layer, the redistribution layer has a plurality of electrical contact pads exposed from the dielectric layer, and at least one of the plurality of electrical contact pads is used as the external connection portion.

2. The electronic package of claim 1, further comprising at least one dam disposed on the first side of the photonic die and surrounding the external connection portion, wherein the plurality of dummy pads surround the dam, and the dam is correspondingly disposed along an edge of the hollow area.

3. The electronic package of claim 1, further comprising a package substrate connected to the second side of the photonic die.

4. The electronic package of claim 3, further comprising at least one stopper disposed on the package substrate and surrounding the photonic die.

5. The electronic package of claim 3, further comprising a heat sink disposed on the package substrate.

6. The electronic package of claim 1, wherein the plurality of dummy bumps include solder material.

7. A method of manufacturing an electronic package, comprising:
    providing a photonic die, an electronic element and a functional part having a concave portion, wherein the photonic die has a first side and a second side opposing the first side and a plurality of conductive vias connecting the first side and the second side, and wherein the first side is configured with an external connection portion and a plurality of electrical contact pads that are electrically connected to the plurality of conductive vias, and the first side is further configured with a plurality of dummy pads that are free from being electrically connected to the plurality of conductive vias and the external connection portion;

disposing the electronic element on the plurality of electrical contact pads on the first side of the photonic die, disposing the functional part on the first side of the photonic die with the concave portion thereof facing the external connection portion by bonding a plurality of dummy bumps onto the plurality of dummy pads, and superimposing the concave portion on the external connection portion, wherein the electronic element is electrically connected to the plurality of conductive vias, and the functional part is free from being electrically connected to the photonic die;

forming a cladding layer on the first side of the photonic die, wherein the cladding layer covers the electronic element and the functional part; and removing a part of a material of the cladding layer and a part of a material of the functional part, wherein the concave portion forms a hollow area penetrating through the functional part, such that the external connection portion is exposed from the hollow area and the cladding layer, wherein the photonic die further has at least one circuit structure disposed on the first side, the circuit structure has at least one dielectric layer and at least one redistribution layer, the electronic element, the functional part, the plurality of dummy bumps and the cladding layer are above the dielectric layer and the redistribution layer, the redistribution layer has the plurality of electrical contact pads exposed from the dielectric layer, and at least one of the plurality of electrical contact pads is used as the external connection portion.

8. The method of claim 7, further comprising disposing at least one dam on the first side of the photonic die, wherein the plurality of dummy pads surround the dam, such that the dam surrounds the external connection portion and is correspondingly disposed along an edge of the hollow area after the hollow area is formed.

9. The method of claim 7, further comprising disposing a package substrate on the second side of the photonic die after forming the hollow area.

10. The method of claim 7, further comprising disposing a package substrate on the second side of the photonic die before forming the hollow area.

11. The method of claim 10, further comprising disposing at least one stopper on the package substrate before forming the hollow area, wherein the stopper surrounds the photonic die.

12. The method of claim 7, wherein the plurality of dummy bumps include solder material.

13. The method of claim 7, wherein a single grinding operation is used to remove the part of the material of the cladding layer and the part of the material of the functional part.

* * * * *